(12) United States Patent
Lee et al.

(10) Patent No.: US 10,364,499 B2
(45) Date of Patent: Jul. 30, 2019

(54) ROLL

(71) Applicant: LG CHEM, LTD., Seoul (KR)

(72) Inventors: Seong Hwan Lee, Daejeon (KR); Dong Ryul Kim, Daejeon (KR); Jang Yeon Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 416 days.

(21) Appl. No.: 14/646,646

(22) PCT Filed: Dec. 2, 2013

(86) PCT No.: PCT/KR2013/011099
§ 371 (c)(1),
(2) Date: May 21, 2015

(87) PCT Pub. No.: WO2014/084700
PCT Pub. Date: Jun. 5, 2014

(65) Prior Publication Data
US 2015/0337439 A1    Nov. 26, 2015

(30) Foreign Application Priority Data

| Nov. 30, 2012 | (KR) | 10-2012-0138317 |
| Dec. 2, 2013 | (KR) | 10-2013-0148680 |
| Dec. 2, 2013 | (KR) | 10-2013-0148681 |
| Dec. 2, 2013 | (KR) | 10-2013-0148682 |

(51) Int. Cl.
*C23C 16/458* (2006.01)
*C23C 16/455* (2006.01)
(Continued)

(52) U.S. Cl.
CPC ....... *C23C 16/458* (2013.01); *B65H 23/0251* (2013.01); *B65H 27/00* (2013.01); *C23C 16/45544* (2013.01); *C23C 16/545* (2013.01); *H01L 21/67132* (2013.01); *H01L 21/67706* (2013.01); *B65H 2404/132* (2013.01); *B65H 2404/1317* (2013.01); *B65H 2404/5211* (2013.01); *B65H 2701/132* (2013.01); *B65H 2801/61* (2013.01)

(58) Field of Classification Search
USPC .......................................... 118/718
See application file for complete search history.

(56) References Cited

U.S. PATENT DOCUMENTS 4,062,094 A * 12/1977 Kuroda ............. B65H 23/0208
26/75
4,692,233 A    9/1987 Casey
(Continued)

FOREIGN PATENT DOCUMENTS

CN    101680083 A    3/2010
CN    102725436 A    10/2012
(Continued)

*Primary Examiner* — Rakesh K Dhingra
(74) *Attorney, Agent, or Firm* — Dentons US LLP

(57) ABSTRACT

Provided are a roll, a film forming apparatus, and a film forming method. The present invention provides a roll used in an apparatus which may transfer a substrate, e.g., a flexible substrate such as a plastic film and a fibrous or metallic web or film and may form a film on a surface of the substrate, a film forming apparatus including the roll, and a film forming method using the film forming apparatus.

12 Claims, 7 Drawing Sheets

(51) Int. Cl.
*C23C 16/54* (2006.01)
*H01L 21/67* (2006.01)
*H01L 21/677* (2006.01)
*B65H 27/00* (2006.01)
*B65H 23/025* (2006.01)

(56) References Cited

U.S. PATENT DOCUMENTS

| | | | | |
|---|---|---|---|---|
| 6,138,885 A * | 10/2000 | Hevenor | B41J 11/0055 |
| | | | 226/16 |
| 6,189,485 B1 * | 2/2001 | Matsuda | C23C 16/24 |
| | | | 118/715 |
| 2002/0170496 A1 | 11/2002 | Ha et al. | |
| 2007/0281089 A1 | 12/2007 | Heller et al. | |
| 2009/0188961 A1 * | 7/2009 | Nakagame | B65H 20/02 |
| | | | 226/97.1 |
| 2009/0272322 A1 | 11/2009 | Fujinami et al. | |
| 2011/0086457 A1 * | 4/2011 | Yokoyama | C23C 14/54 |
| | | | 438/57 |
| 2012/0301615 A1 * | 11/2012 | Honda | C23C 14/541 |
| | | | 427/255.5 |
| 2013/0042774 A1 * | 2/2013 | Yeo | B41F 5/00 |
| | | | 101/216 |
| 2014/0020627 A1 * | 1/2014 | Kano | C23C 16/45551 |
| | | | 118/719 |

FOREIGN PATENT DOCUMENTS

| | | |
|---|---|---|
| EP | 2692899 A1 | 2/2014 |
| JP | 2000-012471 A | 1/2000 |
| JP | 2007-009301 A | 1/2007 |
| JP | 2009-234713 A | 10/2009 |
| JP | 2009-256709 A | 11/2009 |
| JP | 2009-270145 A | 11/2009 |
| JP | 2011-178490 A | 9/2011 |
| JP | 2012-201899 A | 10/2012 |
| KR | 10-2008-0106555 A | 12/2008 |
| KR | 10-2009-0043474 A | 5/2009 |
| TW | 201245487 A1 | 11/2012 |
| WO | 2012/133541 A1 | 10/2012 |

* cited by examiner

[Figure 1]
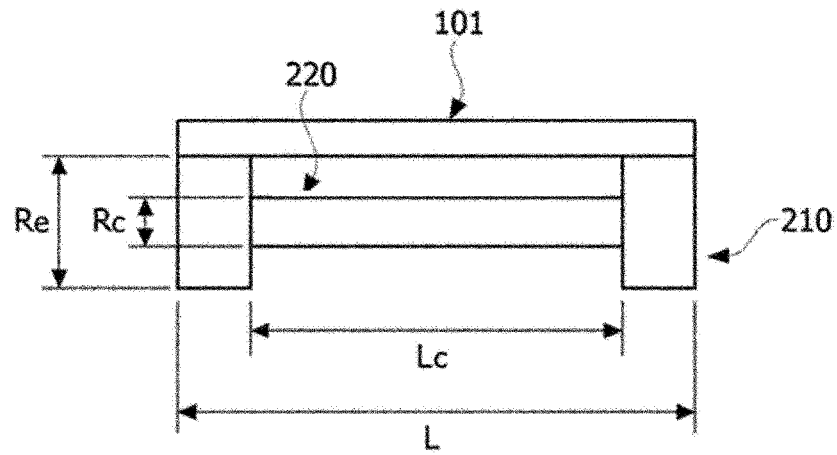
[Figure 2]
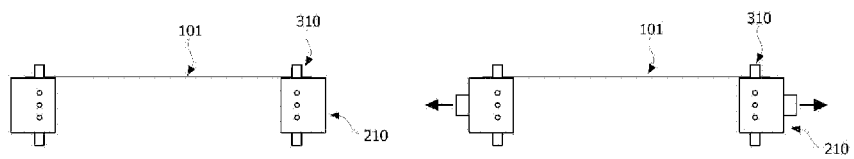
[Figure 3]
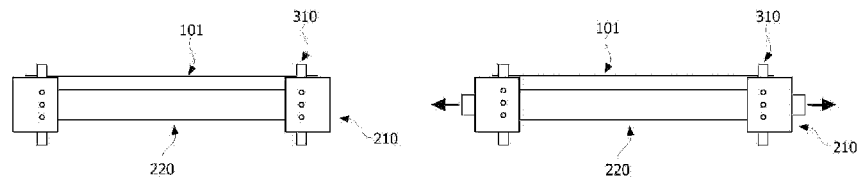
[Figure 4]
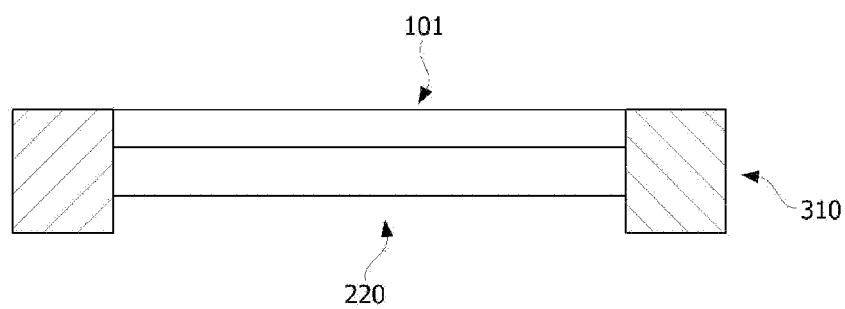
[Figure 5]
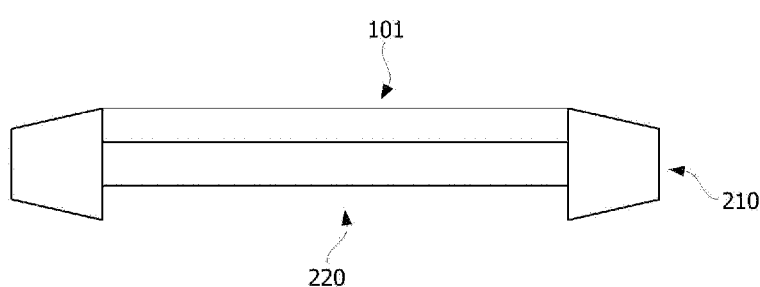

[Figure 6]
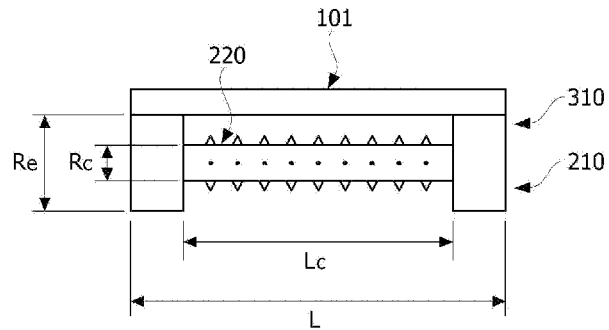
[Figure 7]
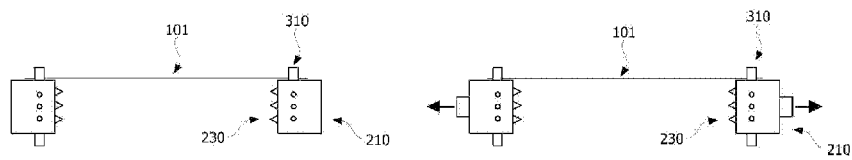
[Figure 8]
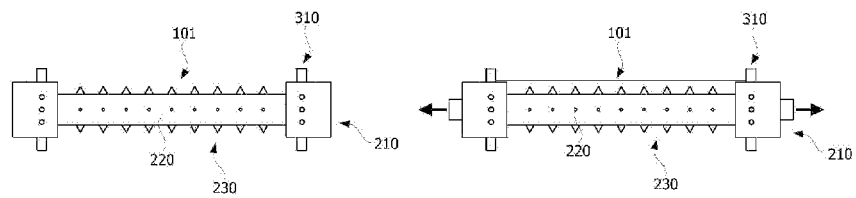
[Figure 9]
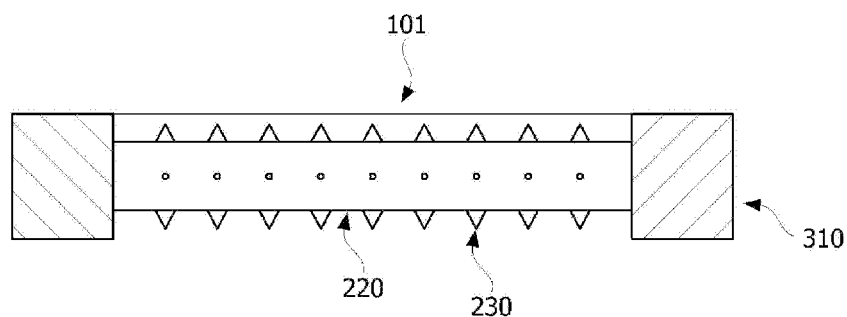
[Figure 10]
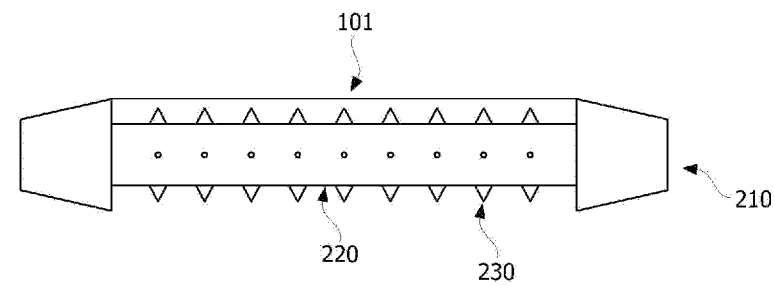

【Figure 11】
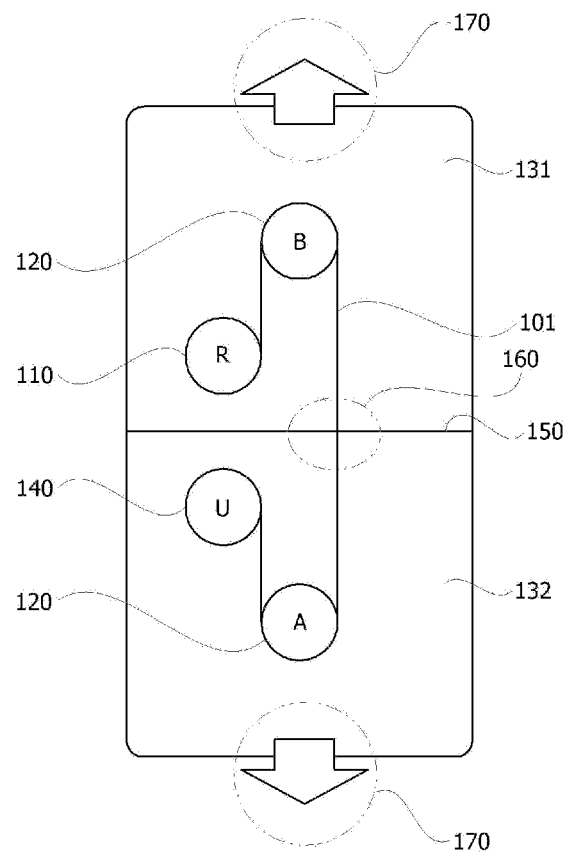
【Figure 12】
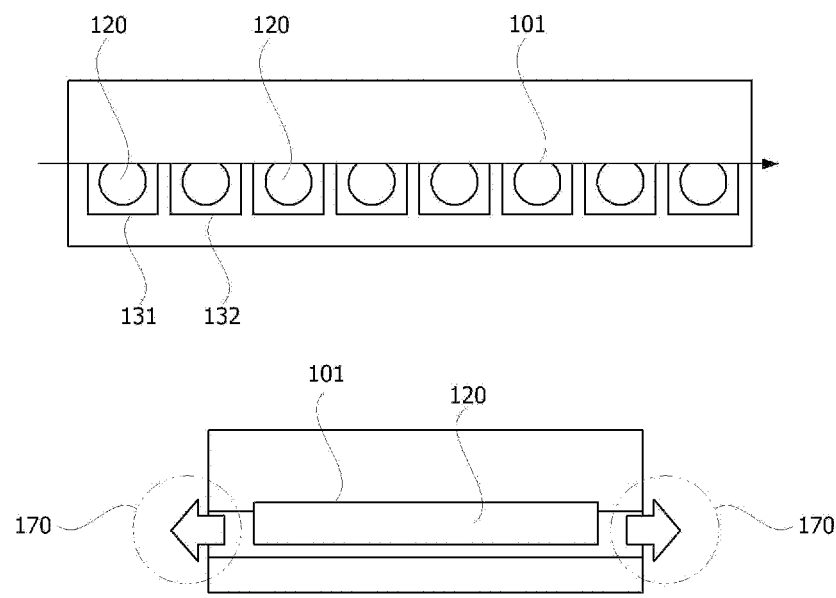

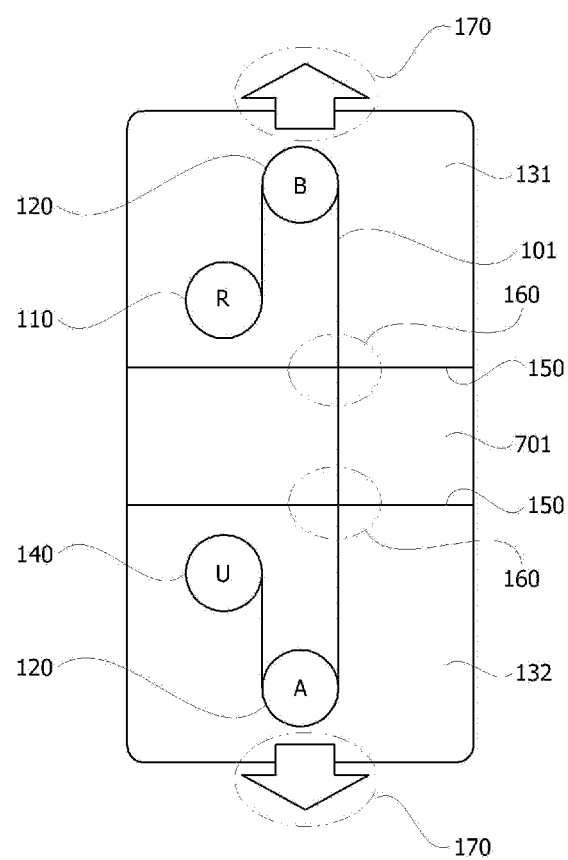
[Figure 13]

【Figure 14】
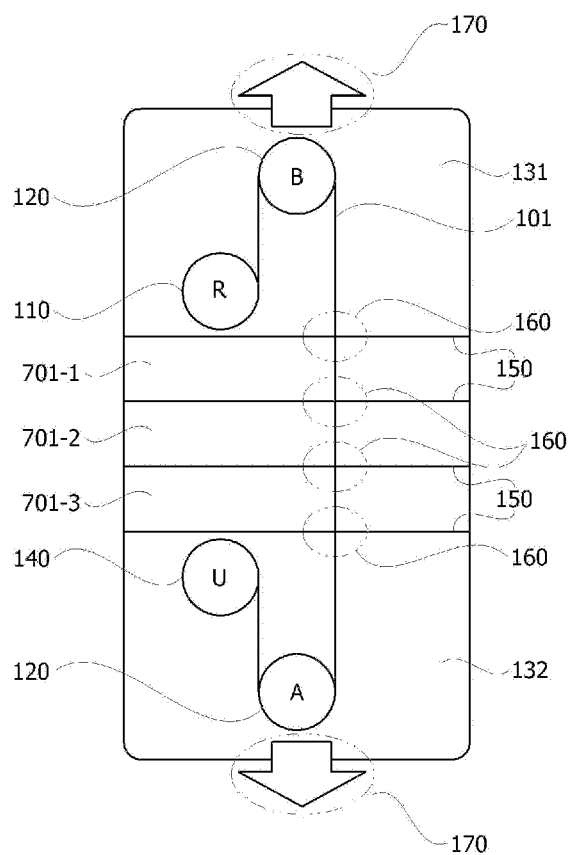

[Figure 15]
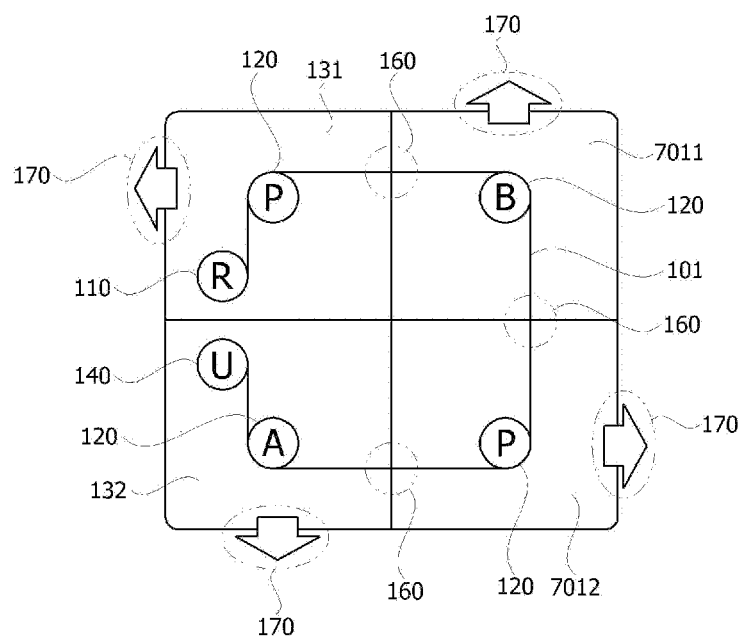

【Figure 16】
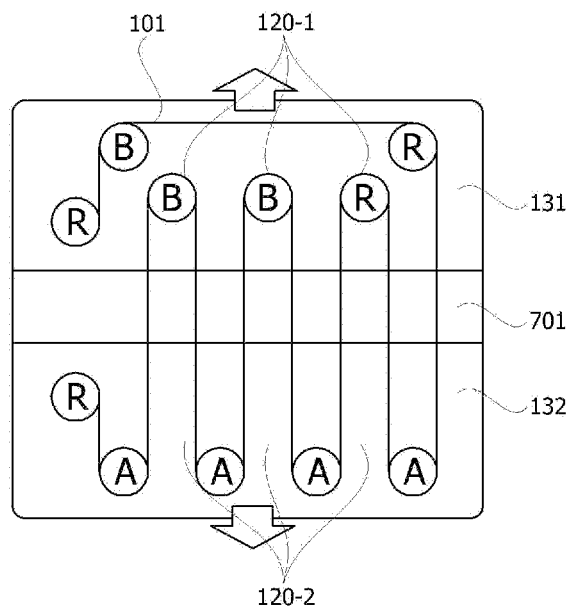
【Figure 17】
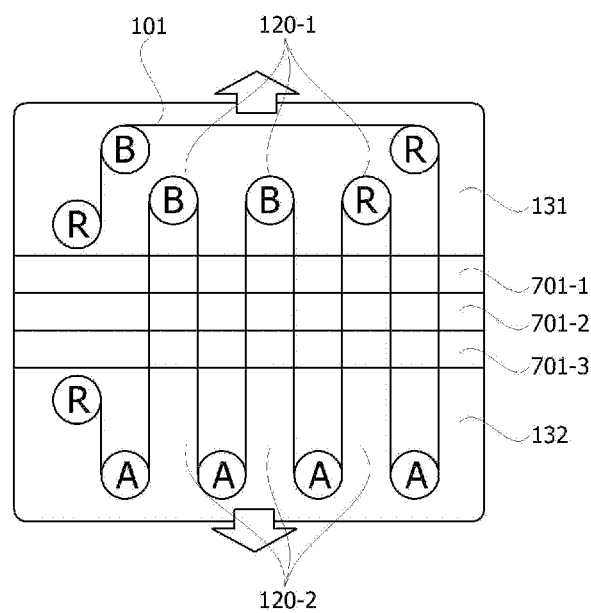

ROLL

CROSS-REFERENCE TO RELATED APPLICATION

This application is a National Stage Entry of International Application No. PCT/KR2013/011099, filed Dec. 2, 2013, and claims the priority to and benefit of Korean Patent Application Nos. 10-2012-0138317, 10-2013-0148680, 10-2013-0148681 and 10-2013-0148682, filed Nov. 30, 2012, Dec. 2, 2013, Dec. 2, 2013 and Dec. 2, 2013, respectively, all of which are hereby incorporated by reference in their entirety for all purposes as if fully set forth herein.

BACKGROUND

1. Field of the Invention

The present invention relates to a roll, a film forming apparatus, and a film forming method.

2. Discussion of Related Art

A technology for forming various kinds of films may be required in various fields, for example, forming of a conformal coating such as a barrier layer, a flexible display coating required in an electroluminescent display, a liquid crystal display (LCD), electrophoresis, or the like, radio frequency identification (RFID), microelectromechanical systems (MEMS), optical coatings, electronic components on a flexible substrate, thin films on the flexible substrate, electrochromics, photoelectromotive force, and the like.

PATENT DOCUMENTS

Patent document 1: U.S. Patent Application Publication No. 2002-0170496
Patent document 2: U.S. Pat. No. 4,692,233

SUMMARY OF THE INVENTION

The present invention is directed to a roll, a film forming apparatus, and a film forming method.

According to an aspect of the present invention, there is provided a so-called roll-to-toll device, for example, a roll used as a guide roll of a film forming apparatus which includes a transferring unit including one or more guide rolls installed to transfer a substrate, and a treating region installed to form a film on a surface of the substrate transferred by the transferring unit.

The roll may have a structure in which an end of the roll has a larger diameter than a central portion thereof, or the central portion does not exist so as to be in contact with both ends of the substrate in a direction perpendicular to a transferring direction of the substrate, but not in contact with other portions of the substrate.

Further, the roll having the structure may include a precursor supplying unit configured to supply a precursor to the substrate.

According to another aspect of the present invention, there is provided a film forming apparatus including the roll used as a guide roll. The film forming apparatus may be, for example, an atomic layer deposition (ALD) apparatus which forms a film by an ALD.

According to yet another aspect of the present invention, there is provided a film forming method which forms a film on a substrate, for example, a flexible substrate such as a plastic film and a metallic or fibrous web or film.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which:

FIGS. 1 to 5 are views illustrating types of exemplary rolls;

FIGS. 6 to 10 are views illustrating types of exemplary precursor supplying rolls; and FIGS. 11 to 17 are views illustrating configurations of exemplary film forming apparatuses.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

An exemplary roll may be a roll used for transferring a substrate.

The roll may have a structure in which at least one end or both ends thereof have a larger diameter than a central portion thereof, or a structure having only the both ends without the central portion. In one example, the roll may include the both ends and the central portion, and the both ends may be installed to be in contact with and transfer the substrate, and the central portion may not exist or may have a smaller diameter than the both ends so as not to be in contact with the substrate during a transferring process of the substrate or may not exist.

FIG. 1 illustrates an exemplary roll. As illustrated in FIG. 1, the roll may include both ends 210 which are in contact with a substrate 101, and a central portion 220 which is not in contact with the substrate 101. A ratio Rc/Re of a diameter Rc of the central portion 220 to a diameter Re of each of the ends 210 is not particularly limited, but may be controlled to enable the substrate 101 to be properly transferred. For example, the ratio Rc/Re may be 0.9 or less, or 0.5 to 0.9. In the structure in which the central portion does not exist, the ratio Rc/Re is 0.

A ratio Lc/L of a length Lc of the central portion 220 or a distance Lc between the both ends 210, in a case that there is not the central portion 220, to a length L of the roll, which is measured in a direction perpendicular to a transferring direction of the substrate 101, is not particularly limited, either, as long as the ends 210 may be secured so as to properly fix the substrate during the transferring process. For example, the ratio Lc/L may be 0.7 to 0.9.

In one example, a protruding portion may be provided at each of the ends of the roll in order to fix the substrate during the transferring process. Since the substrate is fixed by the protruding portion during the transferring process, the substrate may be prevented from being separated or slid.

Further, the roll may have only the both ends without the central portion.

For example, the both ends of the roll may be formed to fix the substrate, while applying a tensile force to the substrate in one direction within an angular range of 70° to 110° with respect to the transferring direction of the substrate, e.g., a vertical direction during the transferring process of the substrate. For example, the ends may be formed to be movable while tensing the substrate in the one direction within the angular range of 70° to 110° with respect to the transferring direction of the substrate, e.g., the vertical direction. In another example, patterns of the ends or the protruding portions provided at the ends may be formed so as to transfer and tense the substrate at the same time.

FIGS. 2 to 5 are views exemplarily illustrating the above mentioned structures.

For example, as illustrated in FIG. 2, the roll may have the structure having only the both ends 210. In this structure, the substrate 101 is fixed to protruding portions 310 of the both ends 210, and the both ends 210 are horizontally moved, and thus the substrate 101 may be transferred while being tensed.

The structure in FIG. 2 may be applied to a roll having the central portion 220, as illustrated in FIG. 3.

FIG. 4 is a view illustrating another type which may transfer the substrate 101 while applying the tensile force to the substrate 101. As illustrated in FIG. 4, the protruding portion 310 may be formed into a predetermined pattern. In this case, the pattern of the protruding portion 310 is not particularly limited. For example, the protruding pattern may include a line shape which forms an angle larger than 0° and less than 90° with respect to a movement direction (the transferring direction) of the substrate. The line shape may be, for example, a comb shape, i.e., a shape illustrated in FIG. 4.

FIG. 5 is a view illustrating yet another type of the structure. As illustrated in FIG. 5, even when each of the both ends 210 has a tapered shape, it is possible to embody the structure which may transfer the substrate 101 while applying the tensile force to the substrate 101. This structure may make an effect in which the both ends 210 pull the substrate 101 in both directions during the transferring process of the substrate 101.

Further, the exemplary roll may be a roll (hereinafter, called a precursor supplying roll, or a supplying roll) which is used for transferring the substrate, as described above, and installed to supply a precursor to substrate transferred.

The precursor supplying roll may have a precursor supplying unit for supplying the precursor. The precursor supplying roll may have a structure in which both ends thereof have a larger diameter than a central portion thereof, or a structure having only the ends without the central portion. In these structures, a position of the precursor supplying unit is not particularly limited. For example, the precursor supplying unit may be provided at a center of the roll so that the precursor is supplied from the center of the roll, or may be provided at an inner side surface of each of the ends.

In one example, the supplying roll may include the both ends and the central portion, and the both ends may be installed to be in contact with and transfer the substrate, and the central portion may not exist or may have a smaller diameter than the both ends so as not to be in contact with the substrate during a transferring process of the substrate.

FIG. 6 illustrates an exemplary supplying roll. As illustrated in FIG. 6, the supplying roll may include both ends 210 which are in contact with a substrate 101, and a central portion 220 which is not in contact with the substrate 101. In the supplying roll, a ratio Rc/Re of a diameter Rc of the central portion 220 to a diameter Re of each of the ends 210 is not particularly limited, but may be controlled to enable the substrate 101 to be properly transferred and also to secure a sufficient distance for efficiently forming a monolayer on the substrate 101 with the supplied precursor. For example, the ratio Rc/Re may be 0.9 or less. In the structure in which the central portion does not exist, the ratio Rc/Re is 0.

A ratio Lc/L of a length Lc of the central portion 220 or a distance Lc between the both ends 210, in a case in which there is not the central portion 220, to a length L of the supplying roll, which is measured in a direction perpendicular to the transferring direction of the substrate 101, is not particularly limited, either, as long as the ends 210 may be secured so as to properly fix the substrate during the transferring process. For example, the ratio Lc/L may be 0.7 to 0.9.

When the precursor is a liquid or a gas, a spraying orifice 230 as the supplying unit may be provided at the central portion 220 of the supplying roll so as to spray the precursor to the substrate 101, as illustrated in FIG. 6. For example, the precursor may be injected through a side surface of the supplying roll and then sprayed to the substrate 101 through the spraying orifice 230. Although not illustrated in the drawings, for example, the spraying orifice 230 may be formed at an inner side surface of each of the ends 210, i.e., a side surface of each of the ends 210 faced to the central portion 220.

The spraying orifice 230 of the supplying roll may be formed in a well-known manner without any limitation, and, for example, may be formed into a spraying nozzle or the like. For example, the spraying orifice 230 may be installed at the central portion 220 of the supplying roll, as illustrated in FIG. 1, or at the inner side surface of each of the ends 210, although not illustrated in the drawings. In FIG. 6, the spraying orifice 230 has a protruding structure, but may have a depressed structure. The number of the spraying orifices 230 may be properly controlled according to a length of the supplying roll and a surface area to be treated.

A guide roll may have the same structure as the supplying roll, except that the spraying orifice 230 is not provided. That is, the structure of the supplying roll described in the specification may be also applied to the guide roll or an input and collection unit, except the installation of the spraying orifice.

In one example, a protruding portion may be provided at each of the ends of the supplying roll in order to fix the substrate during the transferring process. Since the substrate is fixed by the protruding portion during the transferring process, the substrate may be prevented from being separated or slid.

In the structure in which only the both ends are provided without the central portion, the precursor supplying unit may be formed at one of the two inner side surfaces of the both ends or formed at both of them to be faced with each other.

For example, the both ends of the supplying roll may be formed to fix the substrate, while applying a tensile force to the substrate in one direction within an angular range of about 70° to 110° with respect to the transferring direction of the substrate, e.g., a vertical direction during the transferring process of the substrate. For example, the ends may be formed to be movable while tensing the substrate in the one direction within the angular range of 70° to 110° with respect to the transferring direction of the substrate, e.g., the vertical direction. In another example, patterns of the ends or the protruding portions provided at the ends may be formed so as to transfer and tense the substrate at the same time.

FIGS. 7 to 10 are views exemplarily illustrating the above mentioned structures.

For example, as illustrated in FIG. 7, the supplying roll may have the structure having only the both ends 210. In this structure, the substrate 101 is fixed to protruding portions 310 of the both ends 210, and the both ends 210 are horizontally moved, and thus the substrate 101 may be transferred while being tensed.

The structure in FIG. 7 may be applied to a supplying roll having the central portion 220, as illustrated in FIG. 8.

FIG. 9 is a view illustrating another type which may transfer the substrate 101 while applying the tensile force to the substrate 101. As illustrated in FIG. 9, the protruding portion 310 may be formed into a predetermined pattern. In this case, the pattern of the protruding portion 310 is not particularly limited. For example, the protruding pattern may have a comb shape, i.e., a line shape which forms an angle larger than 0° and less than 90° with respect to the transferring direction of the substrate 101 in an outside direction of the supplying roll so as to transfer the substrate 101 while applying the tensile force to the substrate 101, as illustrated in FIG. 9.

FIG. 10 is a view illustrating yet another type of the supplying roll. As illustrated in FIG. 10, even when each of the both ends 210 has a tapered shape, it is possible to embody the structure which may transfer the substrate 101 while applying the tensile force to the substrate 101. This structure may make an effect in which the both ends 210 pull the substrate 101 in both directions during the transferring process of the substrate 101.

Also, the present invention relates to a film forming apparatus. The film forming apparatus may include a transferring unit and a treating region.

The transferring unit may include a supplying roll for supplying a substrate, one or more guide rolls for transferring the substrate, and a collecting roll for collecting the substrate. At least one of the guide rolls may be a roll having the above-mentions structures.

The treating region is a region in which the substrate is introduced by the transferring unit and a treatment for forming a film is carried out. For example, the treating region may be a general chamber. As described later, when a layer of the precursor is formed on a surface of the substrate in the treating region, the treating region may be formed to receive the precursor. The precursor as a term used in the specification may include all kinds of materials which may form the film, and each of which itself may form the film, or each of which may be applied to the surface of the substrate first and then may form the film by itself or through a reaction with other materials. A state of the precursor is not particularly limited, and may be a gas, a liquid, or a solid (for example, a fine powder).

A mechanism for forming the precursor layer in the treating region is not particularly limited. For example, a method of forming the film, such as an atomic layer deposition (ALD), a CVD, and a sputtering, is already known variously. In a mechanism for forming the film in first and second regions, the mechanism may be selected properly according to employed one out of the above methods.

In one example, the treating region may be disposed to form the film in the ALD.

The exemplary treating region may include at least two regions (hereinafter, called a first region and a second region). Each of the first and second regions may have at least one or more passages, for example, flow-restricting passages. The flow-restricting passage as a term used in the specification may mean a passage through which the substrate may be moved, but the precursor in each region is prevented from being leaked to an outside or another region. A forming method of the passage will be described later. The each region may be disposed to deposit the precursor on the surface of the substrate introduced through the flow-restricting passages and thus form a layer.

At least one guide roll of the transferring unit may be provided in each of the first and second regions. The guide roll may form a path which enables the substrate to pass at least once through the first and second regions through the passage, e.g., the flow-restricting passage.

In the film forming apparatus, at least one of the guide rolls provided in the first and second regions may be a precursor supplying roll which is installed to supply the precursor to the substrate. For example, if the supplying roll is disposed in the first region, a first precursor may be supplied to the substrate by the supplying roll, while the substrate passes through the first region, and a first precursor layer, e.g., a first monolayer may be formed. If the supplying roll is disposed in the second region, a second precursor layer, e.g., a second monolayer may be formed on the surface of the substrate, while the substrate passes through the second region. The supplying roll may be provided in both of the first and second regions. Further, in the region in which the supplying roll is not provided, another well-known unit for supplying the precursor to the corresponding region may be provided. This manner may be proper to, for example, the ALD, and a desired film may be formed on the substrate through a process in which the first and second monolayers or additional another monolayers are repeatedly formed on the substrate by the supplying roll or another unit, as described above. The first and second precursors may be the same or different kinds from each other, and if necessary, the process of forming the first and second monolayers may be repeated multiple times in order to achieve a desired thickness. Further, the film forming apparatus may include a third region in which a third monolayer is formed by a third precursor, or a purging process is carried out by an inert gas.

In the film forming apparatus, the transferring unit may further include an input unit for supplying the substrate to the film forming apparatus. The transferring unit may further include a collection unit for collecting the treated substrate. A kind of each of the input unit and the collection unit is not particularly limited. For example, the input unit may be an unwinding roll which unwinds and supplies the substrate wound in a roll type, and the collection unit may be a rewinding roll which rewinds and collects the substrate.

FIG. 11 is a schematic diagram of an exemplary film forming apparatus.

As illustrated in FIG. 11, the film forming apparatus may include a first region 131 and a second region 132. The transferring unit may include at least one guide roll 120 disposed in each of the first and second regions 131 and 132, a collection unit 140 for collecting the treated substrate 101, and an input unit 110 for supplying the substrate 101. In the drawing, the input unit 110 and the collection unit 140 are disposed in the first and second regions 131 and 132. However, if necessary, one or both of the input unit 110 and the collection unit 140 may be disposed outside the first and second regions 131 and 132. The first and second regions 131 and 132 are partitioned by a wall 150 so as to prevent the precursor in each region from being diffused or leaked to another region. The wall 150 has a passage 160, for example the flow-restricting passage, and the substrate 101 may be moved through the passage 160. An exhausting unit 170 may be provided in each of the first and second regions 131 and 132, and the introduced precursor may be exhausted through the exhausting unit 170.

In the film forming apparatus, the input unit 110 serves to introduce the substrate 101 into the apparatus. The input unit 110 may be, for example, the unwinding roll. The substrate 101 introduced by the input unit 110 is treated while passing through each of the first and second regions 131 and 132 in turn, and then collected by the collection unit 140, for example, the rewinding roll.

At least one of the guide rolls 120 of a transferring unit may be the above-mentioned roll, i.e., the roll having the structure in which the both ends has a larger diameter than the central portion so that only the both ends are in contact with the substrate in the direction perpendicular to the transferring direction of the substrate 101 during the transferring process of the substrate 101, or may be the precursor supplying roll installed to supply the precursor to the substrate 101.

FIG. 12 is a view illustrating another type of the film forming apparatus including the above-mentioned roll. An upper side of FIG. 12 is a side view of the film forming apparatus, and a lower side thereof is a front view of the film forming apparatus.

In one example of FIG. 12, the first and second regions 131 and 132 are arranged, in turn, in a line, and the substrate 101 passes through an upper portion of each of the first and second regions 131 and 132 by the guide rolls 120 in each region 131, 132. Although not illustrated detailedly in the drawing, a path for the substrate 101 is formed by the guide rolls, and may be formed by the passage in the apparatus, e.g., the flow-restricting passage through which the substrate may be moved. In this structure, the precursor may be exhausted from a side surface of each region 131, 132, as illustrated in the lower side of FIG. 12. In FIG. 12, only the first and second regions 131 and 132 are arranged to be repeated alternately. However, in a state in which the film forming apparatus is configured so that the substrate 101 may pass through the first and second regions 131 and 132 in turn, the third region to be described later may be additionally disposed between the first and second regions 131 and 132.

The film forming apparatus may further include the third region. The third region may be, for example, a region through which the inert gas required in the purging process of the ALD is introduced, or the precursor which is the same as or different from that introduced into the first region 131 and/or the second region 132 is introduced. If there is the third region, the third region may be connected with the first region 131 and/or the second region 132 through the flow-restricting passage, and the transferring unit may be installed to enable the substrate to pass through the first and second regions in turn via the third region. For example, the substrate may pass through the first region, the third region, and the second region in turn, or may pass through the second region, the third region, and the first region in turn by the transferring unit.

FIG. 13 is a view exemplarily illustrating a state in which a third region 701 is additionally provided in the film forming apparatus of FIG. 11, and thus the description of FIG. 11 except the existence of the third region 701 may be applied similarly. In FIG. 13, a separate roll is not provided in the third region 701, but if necessary, the supplying roll, the guide roll, or the like may be provided in the third region 701, as illustrated in FIG. 15. In the example illustrated in FIG. 13, a plurality of third regions 701 may be provided. The plurality of third regions 701 may be provided between the first and second regions 131 and 132. Also, the plurality of third regions 701 may be partitioned by the wall 150 having each passage, e.g., each flow-restricting passage 160, and the substrate 101 may pass through the first region 131 and the plurality of third regions 701 through each flow-restricting passage 160, in turn, and then may be introduced into the second region 132. FIG. 14 is a view illustrating an example in which the plurality of third regions 701-1 to 701-3 are provided, as described above. When the plurality of third regions 701-1 to 701-3 are provided, a gas introduced in each of the third regions 701-1 to 701-3 may be the same as or different from each other.

FIG. 15 is a view exemplarily illustrating a state in which two third regions 7011 and 7012 are additionally provided in the film forming apparatus of FIG. 11. The inert gas, or the precursor which is the same as or different from that in the first and/or second region may be introduced into the two third regions 7011 and 7012, and a kind of the precursor or the inert gas introduced into each of the third regions 7011 and 7012 may be also the same as or different from each other.

The transferring unit of the film forming apparatus, for example, the guide rolls may be installed to enable the substrate to pass multiple times through the first and second regions. When the third region is provided, the transferring unit, for example, the guide rolls may be installed to enable the substrate to pass multiple times through the first and second regions via the third region every time. FIG. 16 is a view illustrating the transferring unit which is formed to enable the substrate to pass multiple times through the first and second regions 131 and 132 via the third region 701 every time (i.e., according to the order of the first region-→the third region→the second region→the third region-→the first region→the third region→the second region). FIG. 16 illustrates the case that the third region 701 is provided, but the third region 701 may be not provided. In another example, the plurality of third regions 701-1 to 701-3 may be provided, as illustrated in FIG. 17.

As illustrated in FIG. 16, the transferring unit may include a plurality of first guide rolls (120-1 and so on) provided in the first region 131 and a plurality of second guide rolls (120-2 and so on) provided in the second region 132. At least a part (e.g., 120-1 in the drawing) of the first guide rolls may be formed to change the path of the substrate 101 toward the second region 132, and at least a part (e.g., 120-2 in the drawing) of the second guide rolls may be formed to change the path of the substrate 101 toward the first region 131.

In the above-mentioned film forming apparatus, the substrate may pass through each region by the transferring unit and, in the corresponding region, the precursor may be deposited so as to form the monolayer, or the purging process may be performed. The precursor may be supplied by the above-mentioned precursor supplying roll. Also, if necessary, the film forming apparatus may include another supplying unit as well as the precursor supplying roll. Therefore, the precursor may be introduced into each region by the other supplying unit as well as the precursor supplying roll. The other supplying unit may include a precursor source installed inside or outside each region, and may further include a pipe, a pump, a valve, a tank, and other well-known unit. Further, for example, in a case in which another region like the third region other than the first and second regions is provided and the supplying roll is not provided in the corresponding region, the precursor or the inert gas may be introduced in the corresponding region by the other supplying unit.

In the film forming apparatus, each region may be a chamber which may control an internal pressure through an exhausting process by the exhausting unit or an introduction pressure of the precursor or the inert gas. The chamber may interface with other processing module or equipment for controlling an operation or the like.

In the film forming apparatus, it is necessary to restrict the precursor in each region from being moved into other regions in order to prevent an undesirable reaction caused by mixing the non-deposited precursor on the substrate with a gas in other regions, for example, a non-ALD reaction. Thus, the regions may be connected to each other through the flow-restricting passage, or may be adapted to enable the internal pressure to be further controlled. A method of forming the flow-restricting passage is not particularly limited, and a well-known method may be applied. For example, each passage may be a slit which is slightly thicker and wider than a thickness and width of the substrate passing through the passage. The passage may be formed to allow only a very small clearance when the substrate passes through the passage but enable the substrate to pass through the passage without any scratches from each surface of the passage. For example, the clearance may be defined within an extent between a few microns and a few millimeters. Further, the passage may be formed to include an elongated tunnel through which the substrate may pass, and if necessary, may further include a wiper for further limiting a flow of gas through the passage. Also, the passage may be an extended long and narrow passage, and the inert gas injected into the third region or the like may be directly injected into the passage at middle portions of the first and second regions and thus may assist prevention of moving and mixing of the precursor.

In order to prevent the mixing of the precursor, a pressure difference may be formed between the regions. For example, as illustrated in FIG. 13 or 16, if the third region 701 is provided between the first and second regions 131 and 132, the mixing of the precursor may be prevented by injecting the inert gas or the precursor into the third region 701 with a larger pressure than that in each of the first and second regions 131 and 132. For example, the pressure may be controlled by throttling an exhausting flow of the gas or manually exhausting the gas. In another example, the pressure difference may be formed by performing a pumping operation in the corresponding region using a pump or another sucking source. For example, the pump may be connected with all of the regions and then controlled to produce the pressure difference by regulating the pressure in each region. The movement of the precursor may be prevented by controlling a relative flow rate and a pumping speed of the gas using a flow control valve or another flow control device. Further, it is possible to assist maintenance of the desired pressure difference by controlling a gas injection speed and an exhaust flow rate.

Furthermore, the present invention relates to a film forming method. For example, the film forming method may be the ALD. For example, this method may be carried out using the above-mentioned film forming apparatus. For example, while the substrate is transferred along the path formed through the passage by the guide rolls of the film forming apparatus, the first monolayer may be formed on the substrate in the first region by supplying the precursor using the precursor supplying roll or another supplying unit, and the second monolayer may be formed on the substrate in the second region by supplying the precursor using the precursor supplying roll or another supplying unit, whereby a film may be formed on the substrate. This process may be repeated twice or more in order to obtain a desired thickness of the film, and if necessary, one or more third regions may be provided so as to perform the purging process between the processes of forming the first and second monolayers, or form a third monolayer made of a different material from those of the first and second monolayers.

A kind of the substrate used in the film forming method is not particularly limited, and may be formed of, for example, glass, a plastic film, a metallic web, a fibrous film, or the like. Further, a kind of the film formed on the substrate by the film forming method may include all of well-known films formed by the ALD or predicted films to be formed by the ALD, for example, a barrier layer, a conductive layer, a dielectric layer, an insulating layer, an emissive layer, an electron transport layer, an electron injection layer, a hole injection layer, a hole transport layer, or the like.

Also, a kind of the precursor used for forming the film is not particularly limited and, for example, may include all of well-known kinds which may applied to the ALD and may form the above-mentioned kinds of films.

What is claimed is:

1. A roll to transfer a substrate, comprising:
   a) two ends without a central portion so that only the two ends are in contact with the substrate;
   b) a protruding portion provided at each of the two ends of the roll at a surface that contacts the substrate, the protruding portion configured to fix the substrate during the transferring process, the protruding portion having a comb shape comprising lines that form an angle larger than 0° and less than 90° with respect to a transferring direction of the substrate to transfer the substrate while applying a tensile force to the substrate during the transferring process of the substrate; and
   c) one or more spraying orifices configured to spray a precursor onto the substrate during a transferring process of the substrate, the spraying orifices located at an inner planar side surface of each of the two ends.

2. A film forming apparatus comprising:
   a transferring unit including one or more guide rolls installed to transfer a substrate; and
   a treating region installed to form a film on a surface of the substrate transferred by the transferring unit,
   wherein at least one of the guide rolls is the roll of claim 1.

3. The apparatus of claim 2, wherein the treating region is installed to form the film on the substrate through an ALD manner.

4. The apparatus of claim 2, wherein the treating region comprises first and second regions which are respectively installed to form a layer of a precursor on the substrate, and one or more guide rolls are provided in each of the first and second regions and thus form a path through which the substrate passes through the first and second regions in turn.

5. The apparatus of claim 4, further comprising a pump configured to exhaust the precursor in the first or second region.

6. The apparatus of claim 4, wherein the transferring unit is installed to enable the substrate to pass multiple times through the first and second regions.

7. The apparatus of claim 4, further comprising a third region which is installed to enable an inert gas or the precursor to be supplied therein,
   wherein the third region is connected with the first or second region, and the transferring unit is formed to enable the substrate to pass through the first region, the third region, and the second region in turn, or the second region, the third region, and the first region in turn.

8. The apparatus of claim 7, wherein the transferring unit is installed to enable the substrate to pass multiple times through the first and second regions via the third region every time.

9. The apparatus of claim 4, wherein the transferring unit comprises a plurality of first guide rolls provided in the first region and a plurality of second guide rolls provided in the second region, and at least a part of the first guide rolls is formed to change the path of the substrate toward the second region, and at least a part of the second guide rolls is formed to change the path of the substrate toward the first region.

10. A method of forming a film on a substrate using the film forming apparatus of claim 2.

11. The method of claim 10, wherein the substrate is formed of a plastic film, a metallic web, or a fibrous film.

12. The roll of claim 1, wherein each of the two ends has a tapered shape.

\* \* \* \* \*